United States Patent
Nam

(10) Patent No.: US 8,952,434 B2
(45) Date of Patent: Feb. 10, 2015

(54) MAGNETIC PATTERNS AND METHODS OF FORMING MAGNETIC PATTERNS

(75) Inventor: Kyung-Tae Nam, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 13/490,681

(22) Filed: Jun. 7, 2012

(65) Prior Publication Data

US 2012/0315707 A1    Dec. 13, 2012

(30) Foreign Application Priority Data

Jun. 7, 2011  (KR) ........................ 10-2011-0054374

(51) Int. Cl.
| | | |
|---|---|---|
| *H01L 21/00* | (2006.01) | |
| *G11B 5/33* | (2006.01) | |
| *H01L 43/12* | (2006.01) | |
| *H01L 27/22* | (2006.01) | |

(52) U.S. Cl.
CPC ............... *H01L 43/12* (2013.01); *H01L 27/228* (2013.01)
USPC ....................................... 257/295; 360/324.2

(58) Field of Classification Search
None
See application file for complete search history.

(56) References Cited

U.S. PATENT DOCUMENTS

| | | |
|---|---|---|
| 7,527,986 B1 | 5/2009 | Jung |
| 2002/0146887 A1 | 10/2002 | Liu et al. |
| 2006/0221511 A1* | 10/2006 | Saruki et al. ................ 360/324.2 |
| 2007/0002504 A1* | 1/2007 | Huai et al. ................ 360/324.12 |
| 2009/0108383 A1* | 4/2009 | Horng et al. ................... 257/421 |

FOREIGN PATENT DOCUMENTS

| | | |
|---|---|---|
| JP | 2001-168418 | 6/2001 |
| KR | 1020090067371 A | 6/2009 |

* cited by examiner

*Primary Examiner* — Seahvosh Nikmanesh
(74) *Attorney, Agent, or Firm* — Renaissance IP Law Group LLP

(57) ABSTRACT

In a method of forming a magnetic pattern, a lower electrode layer is formed on a substrate. An insulating interlayer is formed on the lower electrode layer. The insulating interlayer is partially removed to form an opening. A first pinned layer pattern filling the opening is formed. A second pinned layer, a tunnel barrier layer, a free layer and an upper electrode layer are formed on the insulating interlayer and the first pinned layer pattern. The upper electrode layer, the free layer, the tunnel barrier layer and the second pinned layer are patterned to form a second pinned layer pattern, a tunnel barrier pattern, a free layer pattern and an upper electrode. The second pinned layer pattern covers an upper surface of the first pinned layer pattern.

4 Claims, 12 Drawing Sheets

MAGNETIC PATTERNS AND METHODS OF FORMING MAGNETIC PATTERNS

CROSS-REFERENCE TO RELATED APPLICATION

This application claims priority under 35 USC §119 to Korean Patent Application No. 10-2011-0054374 filed on Jun. 7, 2011 in the Korean Intellectual Property Office (KIPO), the entire disclosure of which is incorporated herein by reference.

BACKGROUND

1. Technical Field

Example embodiments relate to magnetic patterns and methods of forming magnetic patterns. More particularly, example embodiments relate to magnetic patterns including magnetic transition metal and methods of forming magnetic patterns including magnetic transition metal.

2. Description of the Related Art

A magnetic device may enable high speed read/write operations with non-volatile characteristics, and thus provide a next generation memory or logic device. The magnetic device may include a magnetic material that is not used in conventional semiconductor devices. This magnetic material may be difficult to pattern using a conventional etching process, such as a reactive ion etching process, and thus may need to be patterned using a physical etching process, such as an ion sputtering process, for instance. Unfortunately, however, during the physical etching process, an etched magnetic material may be reattached to a magnetic pattern resulting in a re-sputtering phenomenon. More particularly, when the etched magnetic material is attached to a sidewall of a tunnel barrier layer pattern of a magnetic tunnel junction (MTJ) structure through the re-sputtering phenomenon, a pinned layer pattern and a free layer pattern may be short-circuited to each other.

SUMMARY

Example embodiments provide a magnetic pattern that helps prevent short-circuiting.

Example embodiments provide a method of forming a magnetic pattern that helps prevent short-circuiting.

According to example embodiments, there is provided a method of forming a magnetic pattern. In the method, a lower electrode layer is formed on a substrate. An insulating interlayer is formed on the lower electrode layer. The insulating interlayer is partially removed to form an opening. A first pinned layer pattern is formed, filling the opening. A second pinned layer, a tunnel barrier layer, a free layer and an upper electrode layer are formed on the insulating interlayer and the first pinned layer pattern. The upper electrode layer, the free layer, the tunnel barrier layer and the second pinned layer are patterned to form a second pinned layer pattern, a tunnel barrier pattern, a free layer pattern and an upper electrode. The second pinned layer pattern covers an upper surface of the first pinned layer pattern.

In example embodiments, in the formation of the first pinned layer pattern, a first pinned layer filling the opening may be formed on the insulating interlayer. The first pinned layer may be planarized until an upper surface of the insulating interlayer is exposed In example embodiments, a RF plasma treatment may be performed on the first pinned layer pattern to cure damage therein. An additional pinned layer may be further formed on the first pinned layer pattern and the first insulating interlayer.

In example embodiments, the additional pinned layer may include the same material as that of the first pinned layer pattern. The additional pinned layer may have a thickness of from about 1 Å to about 10 Å.

In example embodiments, a thickness of the first pinned layer pattern may be greater than about 50% of a thickness of a structure including the second pinned layer pattern, the tunnel barrier layer pattern and the free layer pattern.

In example embodiments, the second pinned layer may include a first ferromagnetic layer, a coupling layer and a second ferromagnetic layer.

In example embodiments, the first ferromagnetic layer and the second ferromagnetic layer may have magnetization directions different from each other.

In example embodiments, the first pinned layer may include PtMn, IrMn, FePt or CoPt. These may be used alone or in any combination thereof.

In example embodiments, the second pinned layer pattern may have a width greater than that of the first pinned layer pattern.

In example embodiments, the upper electrode layer, the free layer, the tunnel barrier layer and the second pinned layer may be patterned by an ion-sputtering process.

According to example embodiments, a magnetic pattern is provided. The magnetic pattern includes a lower electrode, an insulating interlayer, a first pinned layer pattern, a second pined layer pattern, a tunnel barrier layer pattern, a free layer pattern and an upper electrode. The lower electrode layer is disposed on a substrate. The insulating interlayer is disposed on the lower electrode layer. The insulating interlayer has an opening therethrough. The first pinned layer pattern at least substantially fills the opening. The second pinned layer pattern, the tunnel barrier layer pattern, the free layer pattern and the upper electrode are sequentially stacked on the insulating interlayer and the first pinned layer pattern. The second pinned layer pattern covers an upper surface of the first pinned layer pattern.

In example embodiments, the second pinned layer pattern may have a width greater than that of the first pinned layer pattern.

In example embodiments, an additional pinned layer pattern may be further disposed between the first pinned layer pattern and the second pinned layer pattern. The additional pinned layer pattern may include the same material as that of the first pinned layer pattern.

In example embodiments, the first pinned layer pattern and the second pinned layer pattern may each have horizontal magnetization directions.

In example embodiments, the first pinned layer pattern and the second pinned layer pattern may have fixed vertical magnetization directions that are different from each other.

According to example embodiments, the first pinned layer pattern may be formed prior to performing a patterning process (e.g., an ion-sputtering process). Thus, a conductive material included in the first pinned layer pattern may be prevented from being resputtered and attached to a sidewall of the tunnel barrier layer pattern. Therefore, short-circuiting between the pinned layer patterns and the free layer pattern may be prevented to reduce the occurrence of operational failures of a magnetic memory or logic device.

BRIEF DESCRIPTION OF THE DRAWINGS

Example embodiments will be more clearly understood from the following detailed description taken in conjunction with the accompanying drawings.

FIG. 1 is a cross-sectional view illustrating a magnetic pattern in accordance with example embodiments;

FIGS. 2 to 9 are cross-sectional views illustrating a method of forming a magnetic pattern in accordance with example embodiments;

FIGS. 10 to 13 are cross-sectional views illustrating a method of manufacturing a magnetic memory device in accordance with example embodiments;

FIG. 14 is a cross-sectional view illustrating a magnetic pattern in accordance with some example embodiments;

FIGS. 15 to 17 are cross-sectional views illustrating a method of forming a magnetic pattern in accordance with some example embodiments;

FIGS. 18 to 20 are cross-sectional views illustrating a method of manufacturing a magnetic memory device in accordance with some example embodiments;

FIG. 21 is a block diagram illustrating a memory system including the magnetic memory device in accordance with example embodiments; and FIG. 22 is a schematic view of an electronic system in which a magnetic device according to an embodiment of the inventive concept is used.

DETAILED DESCRIPTION OF THE EMBODIMENTS

Figure 1:
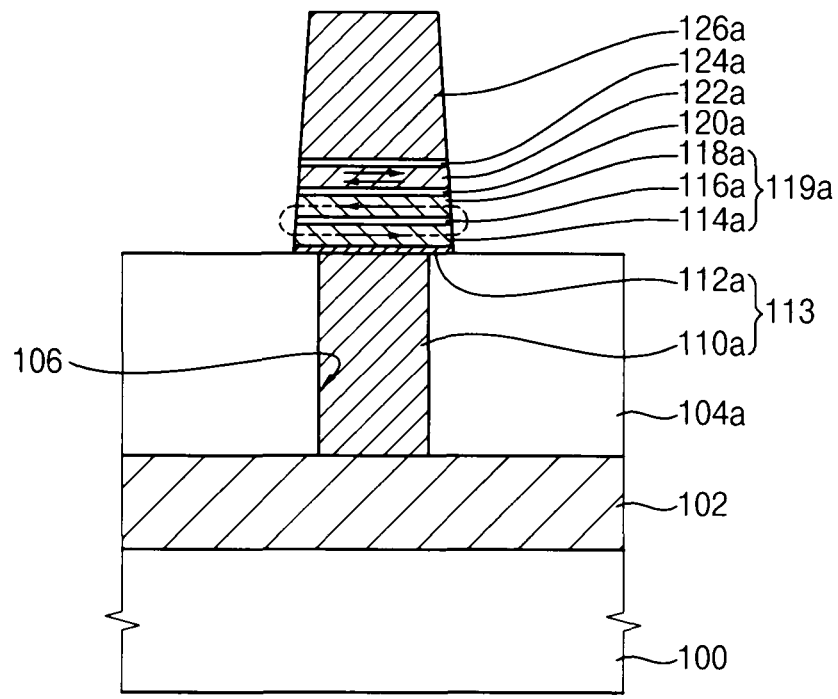
FIGS. 1 to 22 represent non-limiting, example embodiments as described herein.

Various example embodiments will be described more fully hereinafter with reference to the accompanying drawings, in which some example embodiments are shown. The present inventive concept may, however, be embodied in many different forms and should not be construed as limited to the example embodiments set forth herein. Rather, these example embodiments are provided so that this description will be thorough and complete, and will fully convey the scope of the present inventive concept to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, example embodiments will be described in detail with reference to the accompanying drawings.

FIG. 1 is a cross-sectional view illustrating a magnetic pattern in accordance with example embodiments.

Referring to FIG. 1, a magnetic pattern may include a lower electrode layer 102, an insulating interlayer 104a, a first pinned layer pattern 110a formed through the insulating interlayer 104a, an additional pinned layer pattern 112a, a second pinned layer pattern 119a, a tunnel barrier layer pattern 120a, a free layer pattern 122a, a capping layer pattern 124a and an upper electrode 126a. Here, a stack of the first pinned layer pattern 110a, the additional pinned layer pattern 112a, the second pinned layer pattern 119a, the tunnel barrier layer pattern 120a and the free layer pattern 122a may be defined as a magnetic tunnel junction (MTJ) structure.

The lower electrode layer 102 may be disposed on a substrate 100. The substrate may be a semiconductor substrate such as a silicon substrate or silicon on insulator (SOI) substrates. The lower electrode layer 102 may include a metal, e.g., tantalum (Ta).

The insulating interlayer 104a may be disposed on the lower electrode layer 102. The insulating interlayer 104a may have a planar upper surface. The insulating interlayer 104a may include an opening 106 therethrough to expose a portion of the lower electrode layer 102.

The first pinned layer pattern 110a may be disposed in the opening 106 to make contact with the lower electrode layer 102. That is, the first pinned layer pattern 110a may penetrate the insulating interlayer 104a to contact the lower electrode layer 102. The first pinned layer pattern 110a may also have a planar upper surface. The first pinned layer pattern 110a may include a material having a horizontal magnetization direction. The first pinned layer pattern 110a may include multiple pinned layers having different magnetization directions, so that the whole first pinned layer pattern 110a may have no specific magnetization direction. The first pinned layer pattern 110a may include a ferromagnetic material. In some embodiments, the first pinned layer pattern 110a may include cobalt (Co), iron (Fe), terbium (Tb), ruthenium (Ru), palladium (Pd), platinum (Pt), manganese (Mn), iridium (Ir) or alloys of these metals. For example, the first pinned layer pattern 110a may include PtMn or IrMn. The first pinned layer pattern 110a may have a height larger than about 50% of that of the entire MTJ structure.

The additional pinned layer pattern 112a may be disposed on the first pinned layer pattern 110a. The additional pinned layer pattern 112a may include a material substantially the same as that of the first pinned layer pattern 110a. The additional pinned layer pattern 112a may have a width substantially larger than that of the first pinned layer pattern 110a. Accordingly, the additional pinned layer pattern 112a may cover substantially an entire upper surface of the first pinned layer pattern 110a. The additional pinned layer pattern 112a may be relatively thin, having a thickness ranging from about 1 to about 10 Å.

The first pinned layer pattern 110a and the additional pinned layer pattern 112a may serve as a lower pinned layer pattern 113.

The second pinned layer pattern 119a may be disposed on the additional pinned layer pattern 112a. The second pinned layer pattern 119a may have a thickness smaller than that of the first pinned layer pattern 110a. The second pinned layer pattern 119a may cover substantially an entire upper surface of the lower pinned layer pattern 113. The second pinned layer pattern 119a may have a width substantially larger than that of the first pinned layer pattern 110a.

The second pinned layer pattern 119a may serve as a synthetic anti ferromagnet (SAF). The second pinned layer pattern 119a may have a multi-layer stack structure of a first ferromagnetic layer pattern 114a, a coupling layer pattern 116a and a second ferromagnetic layer pattern 118a. For example, the first and second ferromagnetic layer patterns 114a and 118a may include, for example, CoFeB, CoFe, NiFe, FePt, CoPt, etc. In the second pinned layer pattern 119a, the first ferromagnetic layer pattern 114a may have a magnetization direction substantially the same as that of an uppermost portion of the first pinned layer pattern 110a, and the magnetization direction may be fixed. The second ferromagnetic layer pattern 118a may have a magnetization direction different from that of the first ferromagnetic layer pattern 114a and the magnetization direction may be fixed. The coupling layer pattern 116a may include ruthenium. For example, a loop-shaped magnetic field (illustrated by dotted lines) may be generated by the first and second ferromagnetic layer patterns 114a and 118a with the coupling layer pattern 116a intervening therebetween.

The tunnel barrier layer pattern 120a may include an insulating material, e.g., a metal oxide. For example, the tunnel bather layer pattern 120a may include magnesium oxide (MgO) or aluminum oxide ($AlO_x$).

The free layer pattern 122a may have a horizontally switchable magnetization direction. The free layer pattern 122a may include a ferromagnetic material having a high spin polarization degree. For example, the free layer pattern 122a may include, for example, CoFeB, CoFe, NiFe, FePt, CoPt, etc.

The capping layer pattern 124a may include tantalum.

The upper electrode 126a may include a metal or a metal nitride. For example, the upper electrode 126a may include titanium, titanium nitride, tantalum, tantalum nitride, tungsten, tungsten nitride, etc. These may be used alone or in any combination thereof.

A multi-layer stack structure of the second pinned layer pattern 119a, the tunnel barrier layer pattern 120a, the free layer pattern 122a, the capping layer pattern 124a and the upper electrode 126a may have an inclined sidewall.

FIGS. 2 to 9 are cross-sectional views illustrating a method of forming a magnetic pattern in accordance with example embodiments.

Figure 2:
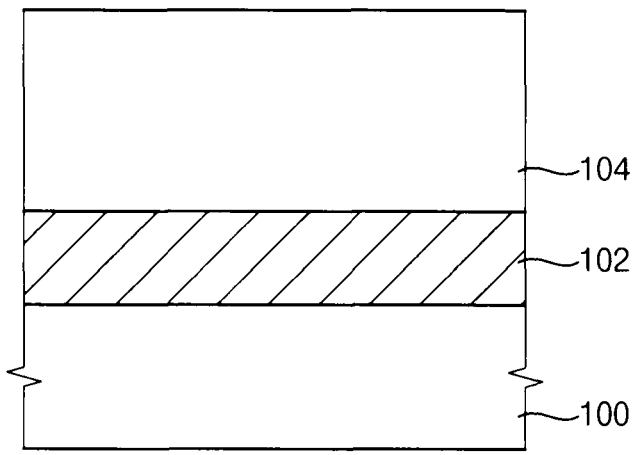

Referring to FIG. 2, a lower electrode layer 102 may be formed on a substrate 100. The substrate 100 may include a semiconductor substrate. The lower electrode layer 102 may be formed by depositing a conductive material such as metal. For example, the lower electrode layer 102 may be formed using tantalum.

A preliminary insulating interlayer 104 may be formed on the lower electrode layer 102. The preliminary insulating interlayer 104 may be formed using a dielectric material such as silicon oxide. The preliminary insulating interlayer 104 may serve as a mold layer for a first pinned layer pattern of a MTJ structure. Thus, the preliminary insulating interlayer 104 may have a thickness substantially equal to or greater than a predetermined thickness of the first pinned layer pattern. For example, the preliminary insulating interlayer 104 may have a thickness corresponding to a sum of the predetermined thickness of the first pinned layer pattern and an extra thickness to be removed by a subsequent polishing process.

Figure 3:
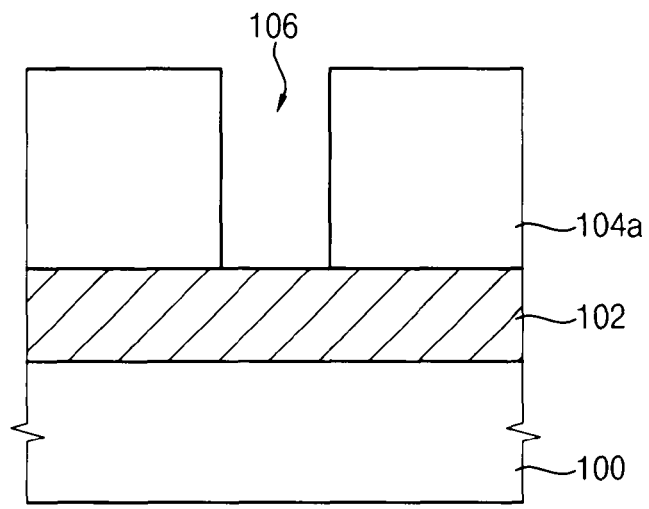

Referring to FIG. 3, a photoresist layer (not illustrated) may be formed on the preliminary insulating interlayer 104 and a first photoresist pattern (not illustrated) may be formed by performing exposure and developing processes on the photoresist layer. The preliminary insulating interlayer 104 may be partially exposed through the first photoresist pattern. The preliminary insulating interlayer 104 may be partially removed using the first photoresist pattern as an etching mask to form an insulating interlayer 104a including an opening 106 therethrough. The lower electrode layer 102 may be partially exposed through the opening 106.

Figure 4:
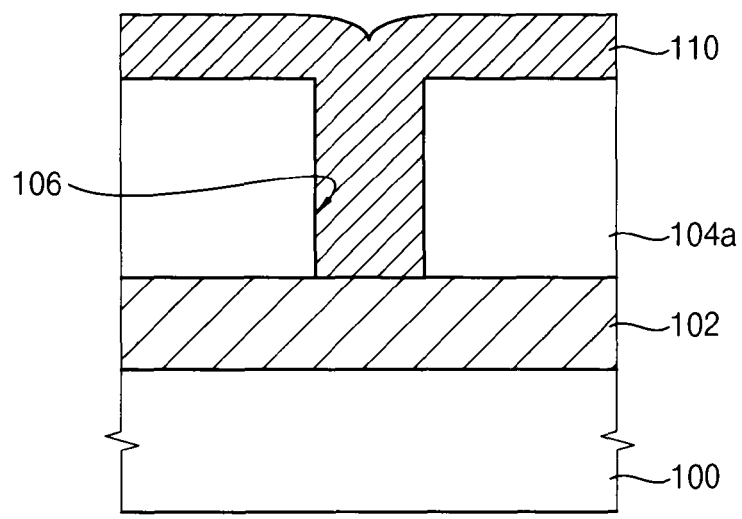

Referring to FIG. 4, a first pinned layer 110 sufficiently filling the opening 106 may be formed on the insulating interlayer 104a. The first pinned layer 110 may be formed by depositing a material that may have a horizontal magnetization direction. The first pinned layer 110 may be formed using Co, Fe, Tb, Ru, Pd, Pt, Mn, Ir or alloys of these metals. For example, the first pinned layer may be formed using PtMn, IrMn. The first pinned layer 110 may have a relatively larger thickness so that the first pinned layer 110 may have enhanced orientation and reduced crystal defects. For example, a portion of the first pinned layer 110 filling the opening 106 may have a thickness greater than about 50% of that of the entire MTJ structure.

Figure 5:
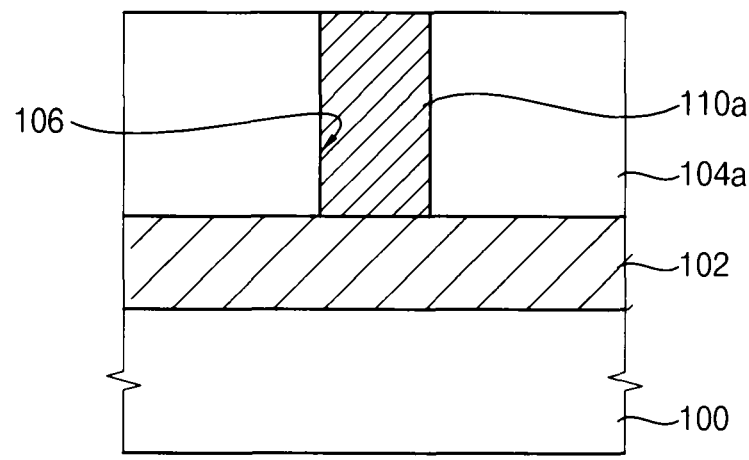

Referring to FIG. 5, a portion of the first pinned layer 110 formed on an upper surface of the insulating interlayer 104a may be removed by, e.g., chemical mechanical polishing (CMP) process. Accordingly, an upper portion of the insulating interlayer 104a may be planarized. As a result, a first pinned layer pattern 110a may be formed in the insulating interlayer 104a. The first pinned layer pattern 110a may have a thickness greater than about 150 Å to provide a good magnetic orientation.

Upper surfaces of the insulating interlayer 104a and the first pinned layer pattern 110a may be substantially coplanar with each other. In this case, the first pinned layer pattern 110a may have some surface damage generated by, e.g., the CMP process.

Figure 6:
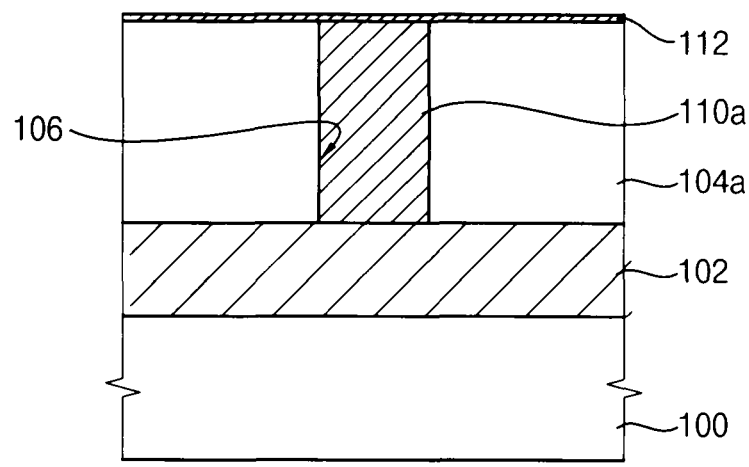

Referring to FIG. 6, a surface cleaning process may be performed on the first pinned layer pattern 110a using RF plasma. By performing the surface cleaning process, the upper surface of the first pinned layer pattern 110a may be finely removed within a thickness range of from about 1 Å to about 10 Å to thereby remove the surface damage.

An additional pinned layer 112 may be formed on the first pinned layer pattern 110a and the insulating interlayer 104a. An additional pinned layer 112 may compensate for a surface-dislocation of the first pinned layer pattern 110a generated by the CMP process and may improve the magnetization orientation of the first pinned layer pattern 110a. The additional pinned layer 112 may be formed to have a very thin structure for the sake of convenience of a subsequent etching process. For example, the additional pinned layer 112 may have a thickness of from about 1 Å to about 10 Å.

The surface cleaning process and a deposition process of the additional pinned layer 112 may be performed in-situ. Alternatively, at least one of the surface cleaning process and the deposition process of the additional pinned layer 112 may be omitted for a process simplicity.

Figure 7:
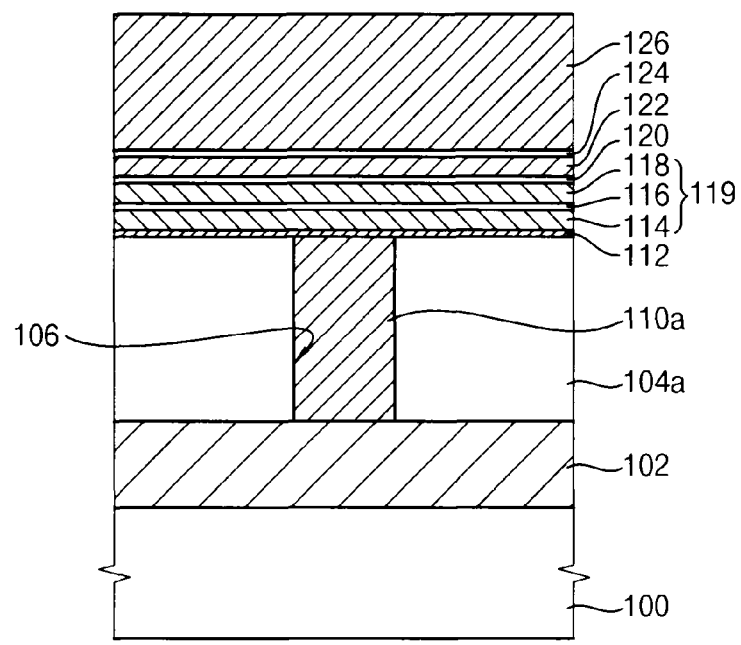

Referring to FIG. 7, a first ferromagnetic layer 114, a coupling layer 116 and a second ferromagnetic layer 118 may be sequentially formed on the additional pinned layer 112 to form a second pinned layer 119. The second pinned layer 119 may have a synthetic anti-ferromagnetic structure. A deposition process of the second pinned layer 119 may be performed in-situ together with the surface cleaning process and the deposition process of the additional pinned layer 112.

The first ferromagnetic layer 114 may have a fixed horizontal magnetization direction. For example, the first ferromagnetic layer 114 may be formed using CoFeB, CoFe, NiFe, etc. The coupling layer 116 may be formed using, for example, ruthenium. The coupling layer 116 may have a relatively thin thickness of from about 1 Å to about 10 Å. The second ferromagnetic layer 118 may have a fixed magnetization direction that is opposite to that of the first ferromagnetic layer 114.

A tunnel barrier layer 120 may be formed on the second pinned layer 119. The tunnel barrier layer 120 may be formed using an insulating material, e.g., a metal oxide. For example, the tunnel barrier layer 120 may be formed using, for example, MgO or $AlO_x$. The tunnel barrier layer 120 may be relatively thin, having a thickness of about 1 Å to about 10 Å.

A free layer 122 may be formed on the tunnel barrier layer 120. The free layer 122 may have a switchable magnetization direction. For example, the free layer 120 may be formed using CoFeB, CoFe, NiFe and so on.

A thickness of a stacked structure including the second pinned layer 119, the tunnel barrier layer 120 and the free layer 122 may be smaller than that of the first pinned layer pattern 110a.

A capping layer 124 may be formed on the free layer 122. The capping layer 124 may be formed using tantalum. The capping layer 124 may be optional. An upper electrode layer 126 may be formed on the capping layer 124. The upper electrode layer 126 may be formed using a metal or a metal nitride. For example, the upper electrode layer 126 may be formed using titanium, titanium nitride, tantalum, tantalum nitride, tungsten, tungsten nitride, etc. These may be used alone or in a combination thereof.

Figure 8:
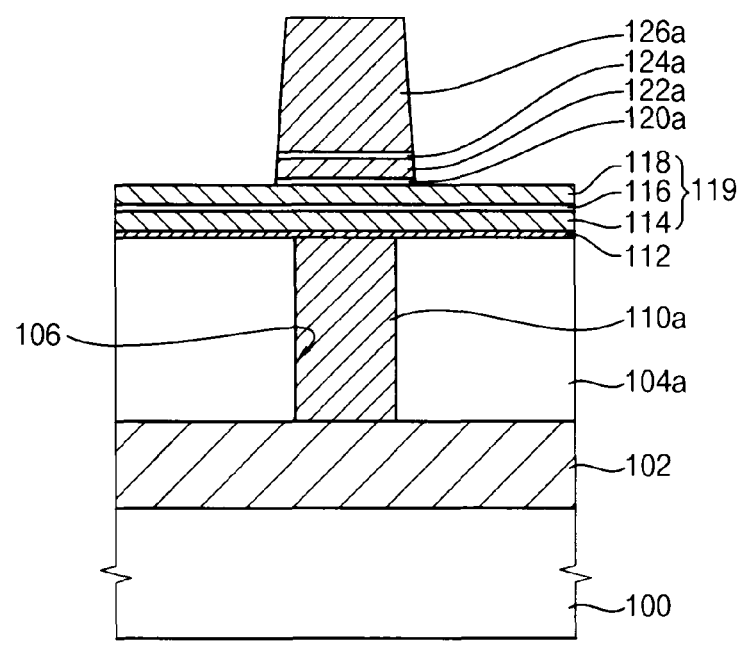

Referring to FIG. 8, a photoresist layer (not illustrated) may be formed on the upper electrode layer 126. Exposure and developing processes may be performed on the photoresist layer to form a second photoresist pattern (not illustrated). The second photoresist pattern may substantially cover the first pinned layer pattern 110a.

The upper electrode layer 126 may be patterned using the second photoresist pattern as an etching mask to form an upper electrode 126a. The capping layer 124, the free layer 122 and the tunnel barrier layer 120 may be sequentially etched using the upper electrode 126a as a hard mask to thereby form a tunnel barrier layer pattern 120a, a free layer pattern 122a and a capping layer pattern 124a. The etching process may include an ion-sputtering process and an additional etching gas may be further provided to facilitate the etching process.

Figure 9:
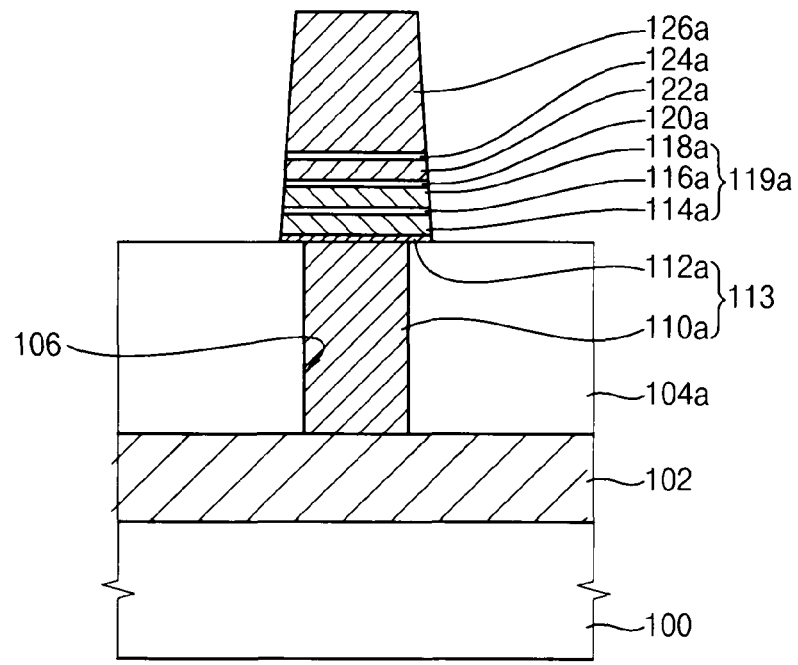

Referring to FIG. 9, the second pinned layer 119 and the additional pinned layer 112 may be successively etched in-situ to form a second pinned layer pattern 119a and the additional pinned layer pattern 112a. The etching process may include an ion-sputtering process and an additional etching gas may be further provided to facilitate the etching process. Accordingly, a magnetic pattern according to example embodiments may be obtained A lower pinned layer pattern 113 including the first pinned layer pattern 110a and the additional pinned layer pattern 112a may be defined.

If the additional pinned layer pattern 112a does not completely cover the first pinned layer pattern 110a, then the upper surface of the first pinned layer pattern 110a may be removed or damaged during the etching process. Thus, the additional pinned layer pattern 112a may preferably have a width larger than that of the first pinned layer pattern 110a. For example, the additional pinned layer pattern 112a may entirely cover the upper surface of the first pinned layer pattern 110a.

A multi-layer structure including the second pinned layer pattern 119a, the tunnel barrier layer pattern 120a, the free layer pattern 122a, the capping layer pattern 124a and the upper electrode 126a may have an inclined sidewall.

According to the above-mentioned processes, the first pinned layer pattern 110a may be formed in advance, and then the additional pinned layer pattern 112a and the multi-layer structure may be formed. Thus, the lower pinned layer pattern 113 including the first pinned layer pattern 110a and the additional pinned layer pattern 112a may not share a continuous sidewall profile with the second pinned layer pattern 119a. For example, the sidewall profile may have a bent or folded shape. Further, the second pinned layer pattern 119a may entirely cover the lower pinned layer pattern 113.

In a conventional process, when the MTJ structure is formed by the ion-sputtering process, the first pinned layer having a relatively large thickness may be etched together with other layers to form the first pinned layer pattern. That is, entire pinned layers under the tunnel bather layer may be etched by the ion-sputtering process, and thus an etching time may be prolonged and etching damage may be generated to the pinned layers during the ion-sputtering process. Further, a conductive material resputtered during the ion-sputtering process may be attached to a sidewall of the tunnel barrier layer pattern to thereby result in short-circuit between the second pinned layer pattern and the free layer pattern.

According to example embodiments, the first pinned layer pattern 110a occupying most of a thickness of the MTJ structure may be formed before performing the ion-sputtering process. That is, an additional etching process may not be required in order to form the first pinned layer pattern 110a. Therefore, an etching thickness or an etching amount to be removed by the ion-sputtering process may be reduced, thereby also reducing etching time and damage done by the etching process.

Specifically, the second pinned layer 119 and the additional pinned layer 112 under the tunnel barrier layer pattern 120a may be etched by the ion-sputtering process, and these layers may have a much smaller thickness than that of the first pinned layer pattern 110a. Thus, the above-mentioned resputtered conductive material may be prevented from being attached to the sidewall of the tunnel barrier layer pattern 120a to thereby prevent short-circuiting. In example embodiments, the thickness of the first pinned layer pattern 110a may be larger than about 50% of that of the MTJ structure. In example embodiments, a thickness of the first pinned layer pattern may be greater than about 50% of a thickness of a structure including the second pinned layer pattern, the tunnel barrier layer pattern and the free layer pattern. Thus, an etching thickness in the ion-sputtering process may be substantially smaller than about 50% of the thickness of the MTJ structure. Therefore, an amount of the resputtered conductive material may be reduced to prevent short-circuit between the second pinned layer pattern 119a and the free layer pattern 122a.

FIGS. 10 to 13 are cross-sectional views illustrating a method of manufacturing a magnetic memory device in accordance with example embodiments.

The magnetic memory device according to example embodiments may be a spin transfer torque magnetic random access memory (STT-MRAM) device. The magnetic memory device may include the magnetic pattern obtained by the above-described process.

Figure 10:
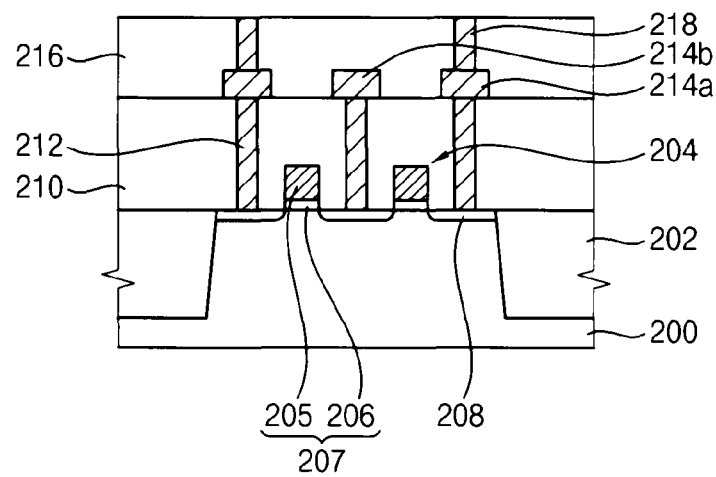

Referring to FIG. 10, an isolation layer pattern 202 such as shallow trench isolation structure may be formed on a substrate 200 to define an active region and an isolation region. The substrate 200 may include a semiconductor substrate. A metal-oxide semiconductor (MOS) transistor 204 for selecting memory cells may be formed on the substrate 200. For example, a gate insulation layer and a gate electrode layer may be sequentially formed on the substrate 200. The gate electrode layer and the gate insulation layer may be patterned to form a gate electrode 205 and a gate insulation layer pattern 206. The gate electrode 205 and the gate insulation layer pattern 206 may form a gate structure 207. Impurities may be implanted into the substrate 200 using the gate structure 207 as an ion-implantation mask to form an impurity region 208 at an upper portion of the substrate 200 adjacent to the gate structure 207. The gate electrode 206 may serve as a word line. A gate spacer (not illustrated) may be further formed on a sidewall of the gate structure 207.

A first insulating interlayer 210 covering the MOS transistor 204 may be formed on the substrate 200. First contact plugs 212 contacting the impurity region 208 may be formed through the first insulating interlayer 210.

A conductive layer may be formed on the first insulating interlayer 210 and the first contact plugs 212. The conductive layer may be patterned to form first and second pads 214a and 214b electrically connected to the first contact plugs 212.

A second insulating interlayer 216 covering the first and second pads 214a and 214b may be formed on the first insulating interlayer 210. Second contact plugs 218 contacting the first pads 214a may be formed through the second insulating interlayer 216.

Afterwards, processes substantially the same as or similar to those illustrated with reference to FIGS. 2 to 9 may be performed to form a magnetic pattern on the second insulating interlayer 216.

According to some embodiments, instead of the MOS transistor 204, a junction diode may be used as a switching element to select memory cells.

Figure 11:
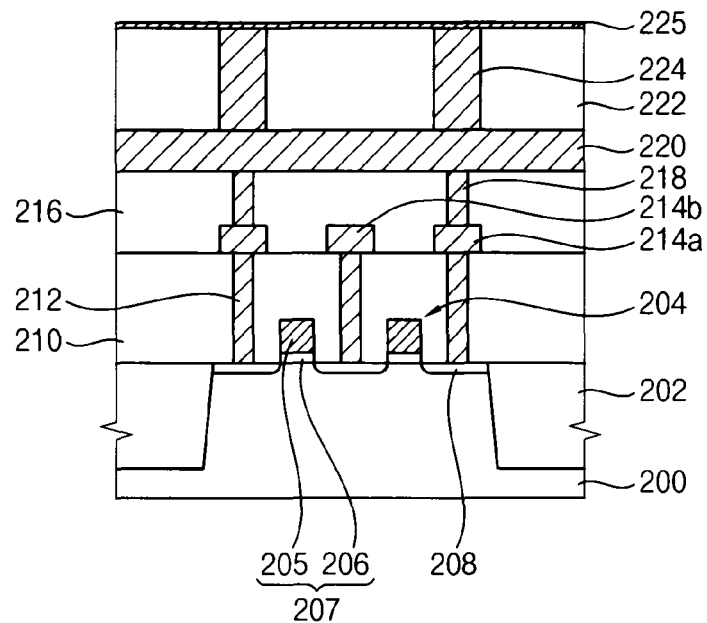

Referring to FIG. 11, a lower electrode layer 220 may be formed on the second insulating interlayer 216 and the second contact plugs 218. A third insulating interlayer 222 may be formed on the lower electrode layer 220. The third insulating interlayer 222 may be partially etched to form an opening (not illustrated) exposing the lower electrode layer 220.

A first pinned layer may be formed to sufficiently fill the opening. An upper portion of the first pinned layer may be planarized by, for example, a CMP process to form a first pinned layer pattern 224 in the opening.

The first pinned layer pattern 224 may be treated by RF plasma so that surface damage of an upper surface of the first pinned layer pattern 224 may be removed or cleaned. An additional pinned layer 225 may be formed on the third insulating interlayer 222 and the first pinned layer pattern 224.

Figure 12:
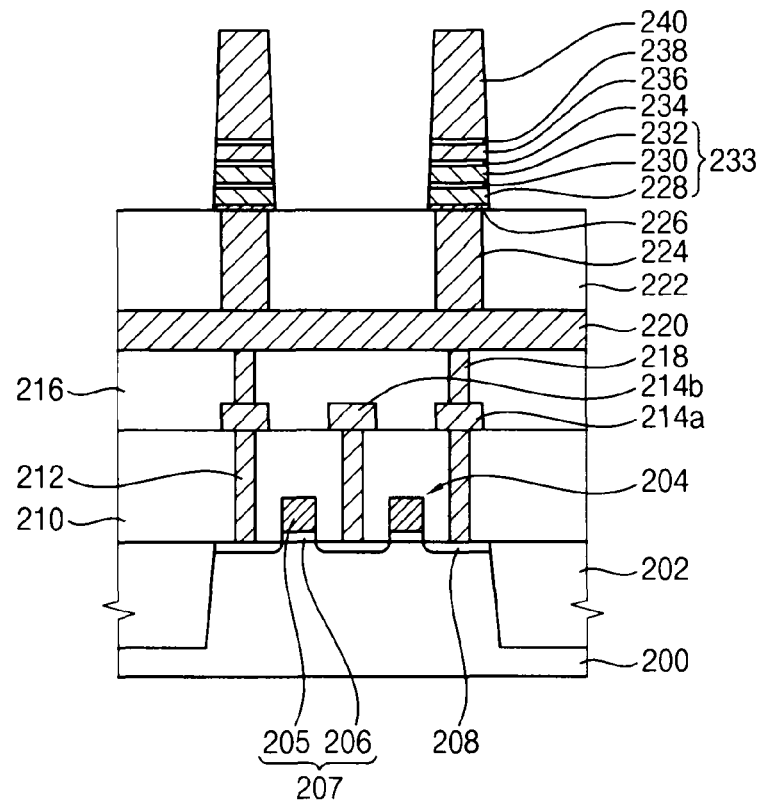

Referring to FIG. 12, a first ferromagnetic layer, a coupling layer and a second ferromagnetic may be sequentially formed on the additional pinned layer 225 to form a second pinned layer. A tunnel barrier layer may be formed on the second pinned layer. A free layer may be formed on the tunnel barrier layer. An optional capping layer and an upper electrode layer may be sequentially formed on the free layer.

A mask pattern (not illustrated) may be formed on the upper electrode layer, and the upper electrode layer may be etched using the mask pattern as an etching mask to form an upper electrode 240. Further, the capping layer, the free layer, the tunnel barrier layer, the second pinned layer and the additional pinned layer 225 may be sequentially etched using the upper electrode 240 as a hard mask to form an additional pinned layer pattern 226, a second pinned layer pattern 233, a tunnel barrier layer pattern 234, a free layer pattern 236 and a capping layer pattern 238. The etching process may include an ion-sputtering process and an additional etching gas may be provided to facilitate the etching process.

According to example embodiments, the first pinned layer pattern 224 may be formed before performing the ion-sputtering process so that the first pinned layer pattern 224 need not be etched by the ion-sputtering process. Therefore, a resputtered conductive material may be substantially prevented from being attached to a sidewall of the tunnel barrier layer pattern 234 to thereby reduce an operation error of the magnetic device.

Figure 13:
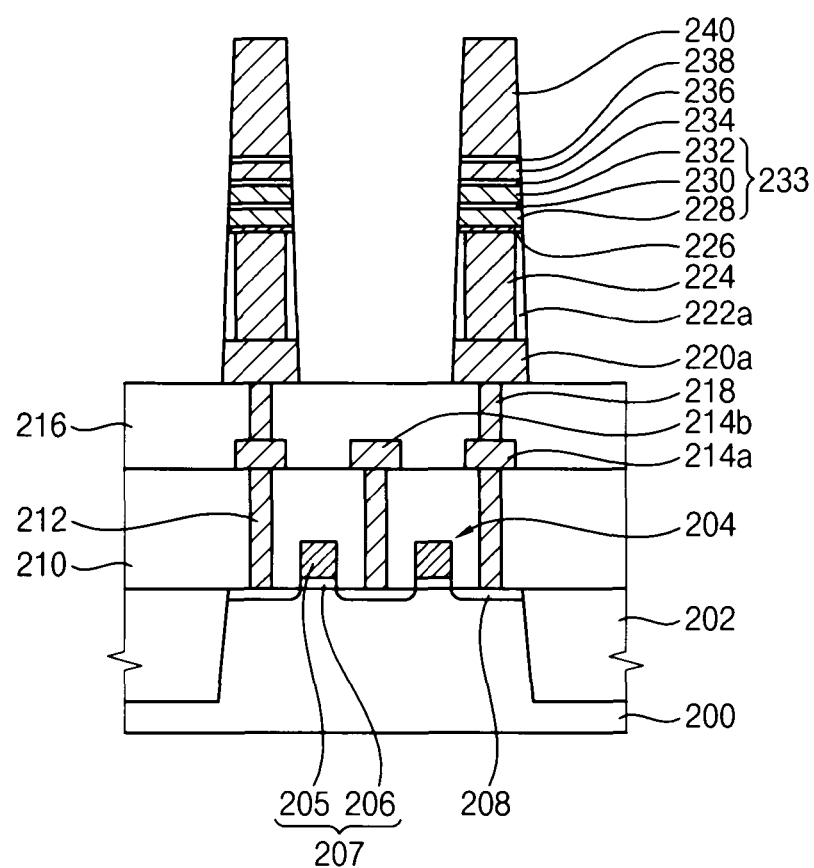

Referring to FIG. 13, the second insulating interlayer 222 may be anisotropically etched. The additional pinned layer pattern 226 may cover substantially the entire upper surface of the first pinned layer pattern 224 so that the first pinned layer pattern 224 may not be exposed during the etching process. Thus, a portion of the second insulating interlayer 222 may remain on a sidewall of the first pinned layer pattern 224 to form a second insulating interlayer pattern 222a. The second insulating interlayer pattern 222a may enclose the sidewall of the first pinned layer pattern 224.

The lower electrode layer 220 may be etched to form a lower electrode 220a. The lower electrode layer 220 may be patterned to have a shape substantially the same as or similar to that of the MTJ structure.

Figure 14:
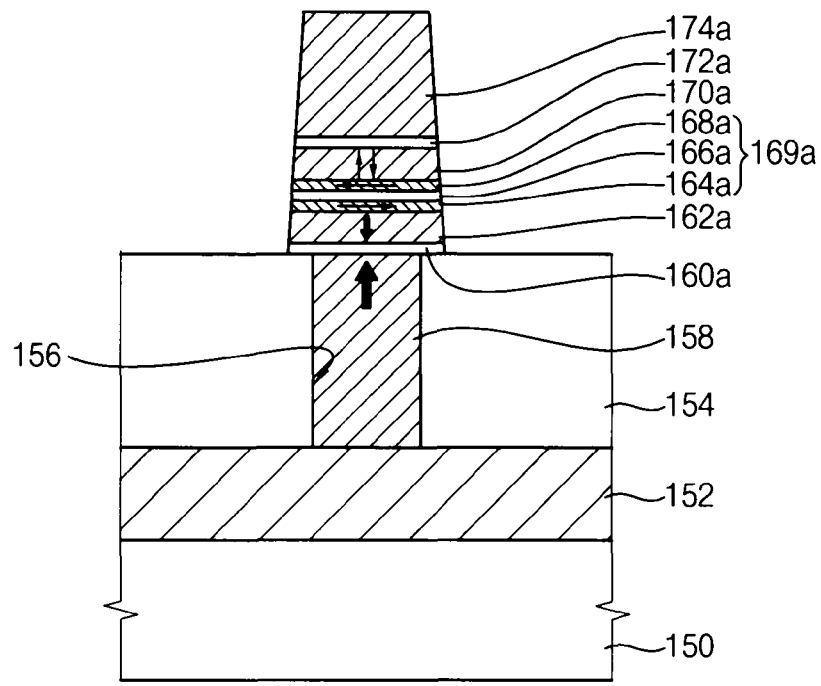

FIG. 14 is a cross-sectional view illustrating a magnetic pattern in accordance with some example embodiments. The magnetic pattern may include a vertical magnetic recording MTJ structure.

Referring to FIG. 14, the magnetic pattern may include a lower electrode layer 152, an insulating interlayer 154 and a lower pinned layer pattern 158 in the insulating interlayer 154. The magnetic pattern may also include a coupling layer pattern 160a, an upper pinned layer pattern 162a, a tunnel barrier layer pattern 169a, a free layer pattern 170a, a capping layer pattern 172a and an upper electrode 174a sequentially stacked on the lower pinned layer pattern 158

The lower electrode layer 152 may be disposed on the substrate 150. For example, the lower electrode layer 152 may include tantalum.

The insulating interlayer 154 may be formed on the lower electrode layer 152. The insulating interlayer 154 may have a substantially planar upper surface. The insulating interlayer 154 may include an opening 156 therethrough. The lower electrode layer 152 may be partially exposed by the opening.

The lower pinned layer pattern 158 may be disposed in the opening to make contact with the lower electrode layer 152. The lower pinned layer pattern 158 may have a fixed vertical magnetization direction.

The coupling layer pattern 160a and the upper pinned layer pattern 162a may be disposed on the lower pinned layer pattern 158. The coupling layer pattern 160a may include ruthenium. The upper pinned layer pattern 162a may have a vertical magnetization direction that is substantially opposite to that of the lower pinned layer pattern 158. The upper pinned layer pattern 162a may have a coercive force substantially lower than that of the lower pinned layer pattern 158.

The coupling layer pattern 160a and the upper pinned layer pattern 162a may have widths larger than that of the lower pinned layer pattern 158. The coupling layer pattern 160a may cover substantially the entire upper surface of the lower pinned layer pattern 158. Accordingly, a sidewall profile of the lower pinned layer pattern 158 and the coupling layer pattern 160a may not have a continuous shape, but may instead have a bent or folded shape.

The upper pinned layer pattern 162a may have a thickness substantially smaller than that of the lower pinned layer pattern 158.

The tunnel barrier layer pattern 169a may include a first interface layer pattern 164a, a metal oxide pattern 166a and a second interface layer pattern 168a sequentially stacked thereon. The first interface layer pattern 164a may have a horizontal magnetization direction. The second interface layer pattern 168a may have a horizontal magnetization direction substantially opposite to that of the first interface layer pattern 164a. The first and second interface layer patterns 164a and 168a may include CoFeB, CoFe, NiFe, etc. The metal oxide pattern 166a may include MgO, AlOx, etc.

The free layer pattern 170a may have a switchable vertical magnetization direction. The free layer pattern 170a may include a ferromagnetic material having a high spin polarization degree. For example, the free layer pattern 170a may include CoFeB, CoFe, NiFe, etc.

The capping layer pattern 172a may include tantalum.

The upper electrode 174a may include a metal or a metal nitride. For example, the upper electrode 174a may include titanium, titanium nitride, tantalum, tantalum nitride, tungsten, tungsten nitride, etc. These may be used alone or in any combination thereof.

Figure 15:
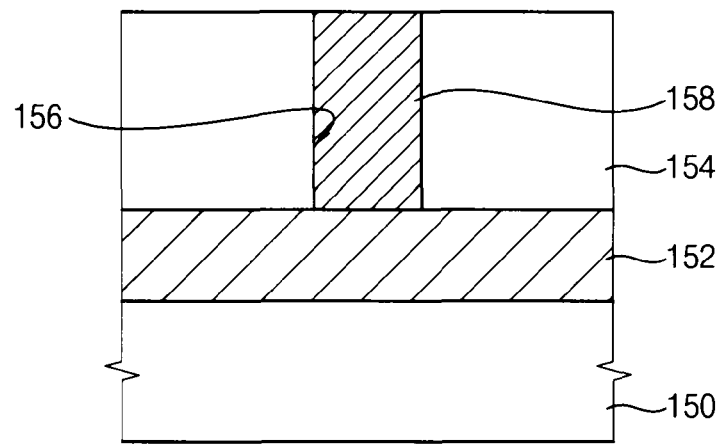
Figure 16:
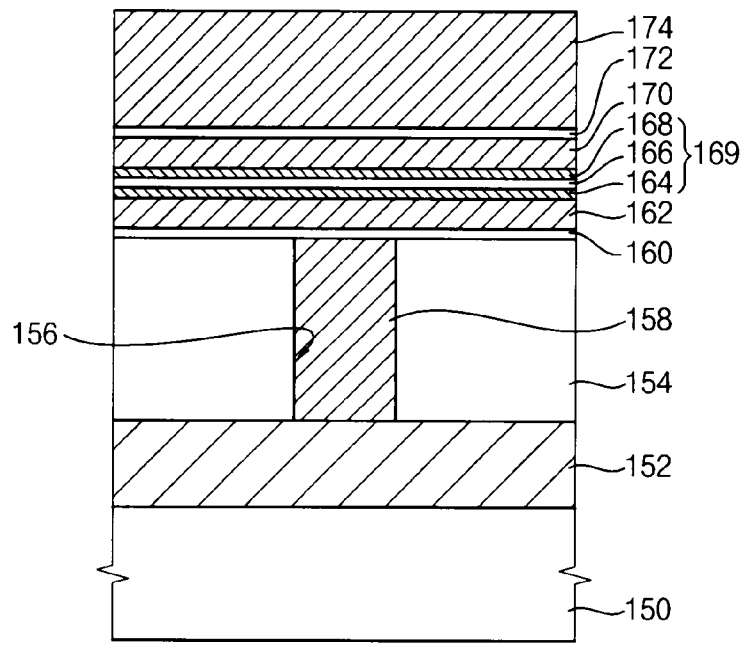
Figure 17:
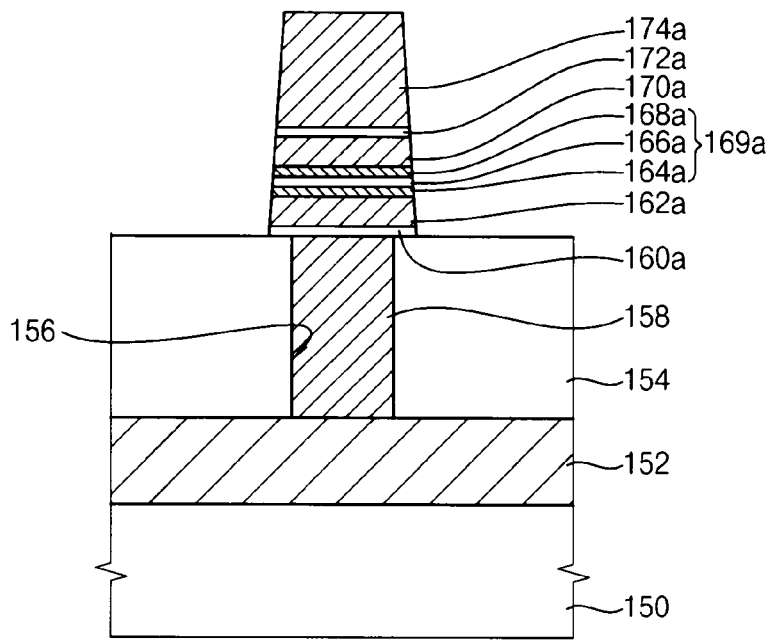

FIGS. 15 to 17 are cross-sectional views illustrating a method of forming a magnetic pattern in accordance with some example embodiments.

Referring to FIG. 15, a lower electrode layer 152 may be formed on a substrate 150. The substrate 150 may be a semiconductor substrate. The lower electrode layer 152 may include tantalum.

A preliminary insulating interlayer may be formed on the lower electrode layer 152. The preliminary insulating interlayer may be formed using a suitable material, e.g., silicon oxide. The preliminary insulating interlayer may serve as a mold layer for forming a lower pinned layer pattern 158 of a MTJ structure.

The preliminary insulating interlayer may be partially etched to form an opening 156 that may expose the lower electrode layer 152. Accordingly, an insulating interlayer 154 including the opening 156 therethrough may be obtained.

A lower pinned layer sufficiently filling the opening 156 may be formed on the insulating interlayer 154. The lower pinned layer may have a substantially vertical magnetization direction. The magnetization direction of the lower pinned layer may be fixed. The lower pinned layer may be formed, for instance, using FePt, CoPt, etc.

An upper portion of the lower pinned layer may be planarized by, e.g., a CMP process to form the lower pinned layer pattern 158 in the insulating interlayer 154. The insulating interlayer 154 may have a substantially planar upper surface by the CMP process. Additionally, upper surfaces of the insulating interlayer 154 and the lower pinned layer pattern 158 may be substantially coplanar with each other.

Optionally, the lower pinned layer pattern 158 may be treated or cleaned by RF plasma so that surface damage of the upper surface of the lower pinned layer pattern 158 may be removed or cleaned. An additional pinned layer (not illustrated) may be further formed on the lower pinned layer pattern 158. The additional pinned layer may have a thickness of from about 1 Å to about 10 Å.

Referring to FIG. 16, a coupling layer 160 and an upper pinned layer 162 may be sequentially formed sequentially on the insulating interlayer 154 and the lower pinned layer pattern 158. The coupling layer 160 may be formed using ruthenium. The upper pinned layer 162 may have a substantially vertical magnetization direction that may be substantially opposite to that of the lower pinned layer pattern 158. The upper pinned layer 162 may be formed using FePt, CoPt, etc. The upper pinned layer 162 may have a smaller thickness than that of the lower pinned layer pattern 158.

A tunnel barrier layer 169, a free layer 170, a capping layer 172 and an upper electrode layer 174 may be sequentially formed on the upper pinned layer 162.

The tunnel barrier layer 169 may be formed by sequentially depositing a first interface layer 164, a metal oxide layer 166 and a second interface layer 168 overlying the upper pinned layer 162. The first interface layer 164 may be formed using a material having a substantially horizontal magnetization direction. For example, the first interface layer 164 may be formed using CoFeB, CoFe, NiFe, etc. The metal oxide layer 166 may be formed using, e.g., MgO or $AlO_x$. The second interface layer 168 may have a magnetization direction substantially opposite to that of the first interface layer 164. The second interface layer 168 may be formed using CoFeB, CoFe, NiFe, etc.

The free layer 170 may be formed using a material having a switchable vertical magnetization direction. For example, the free layer 170 may be formed using CoFeB, CoFe, NiFe, etc.

The capping layer 172 may be formed using tantalum. The upper electrode layer 174 may be formed using tantalum nitride.

Referring to FIG. 17, the upper electrode layer 174 may be partially etched to form an upper electrode 174a. The upper electrode 174a may have a shape covering the upper surface of the lower pinned layer pattern 158.

The capping layer 172, the free layer 170, the tunnel barrier layer 169, the upper pinned layer 162 and the coupling layer 160 may be sequentially etched using the upper electrode 174a as a hard mask to obtain a magnetic pattern.

A coupling layer pattern 160a, an upper pinned layer pattern 162a, a tunnel barrier pattern 169a, a free layer pattern 170a and a capping layer pattern 172a may be formed by the above etching process. The etching process may include an ion-sputtering process and an additional etching gas may be provided to facilitate the etching process. A structure including the coupling layer pattern 160a, the upper pinned layer pattern 162a, the tunnel barrier pattern 169a, the free layer pattern 170a, the capping layer pattern 172a and the upper electrode 174a may have an inclined sidewall.

According to example embodiments, the lower pinned layer pattern 158 may be formed prior to performing the ion-sputtering process. Thus, the lower pinned layer 158 may not be required to be patterned by the ion-sputtering process. Therefore, an etching thickness in the ion-sputtering process may be decreased so that an etching time can be reduced along with damage resulting from the etching process. Accordingly, an amount of the resputtered conductive material may be reduced to prevent short-circuiting that may otherwise occur when the resputtered conductive material is attached to a sidewall of the tunnel barrier layer pattern 169a.

Figure 18:
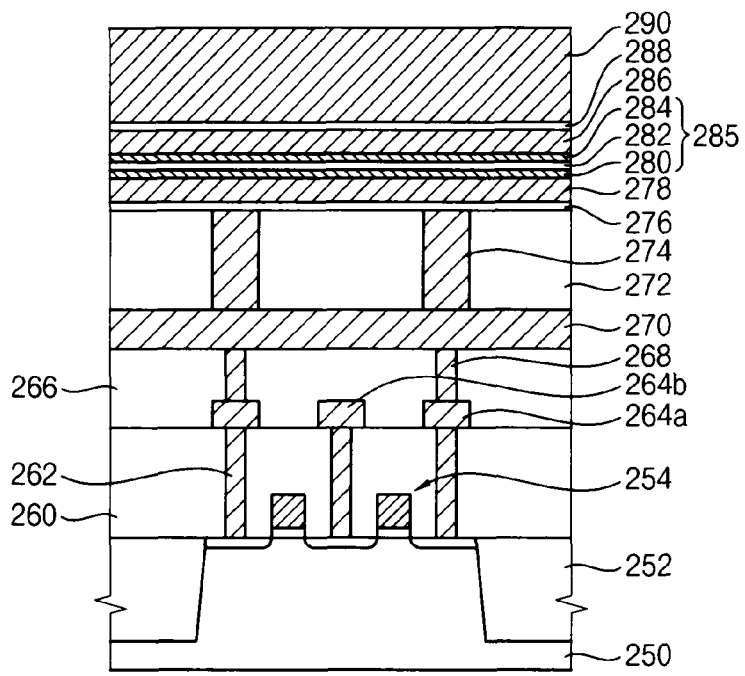
Figure 19:
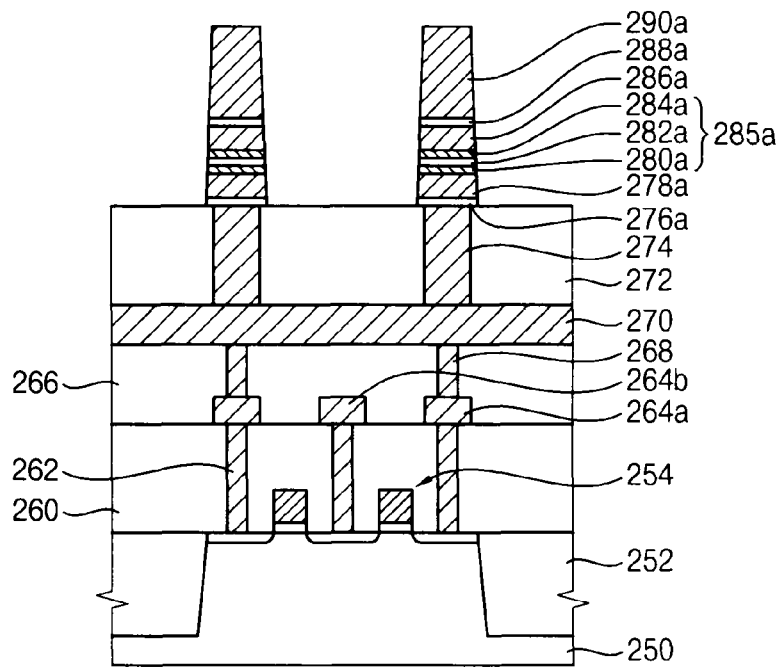
Figure 20:
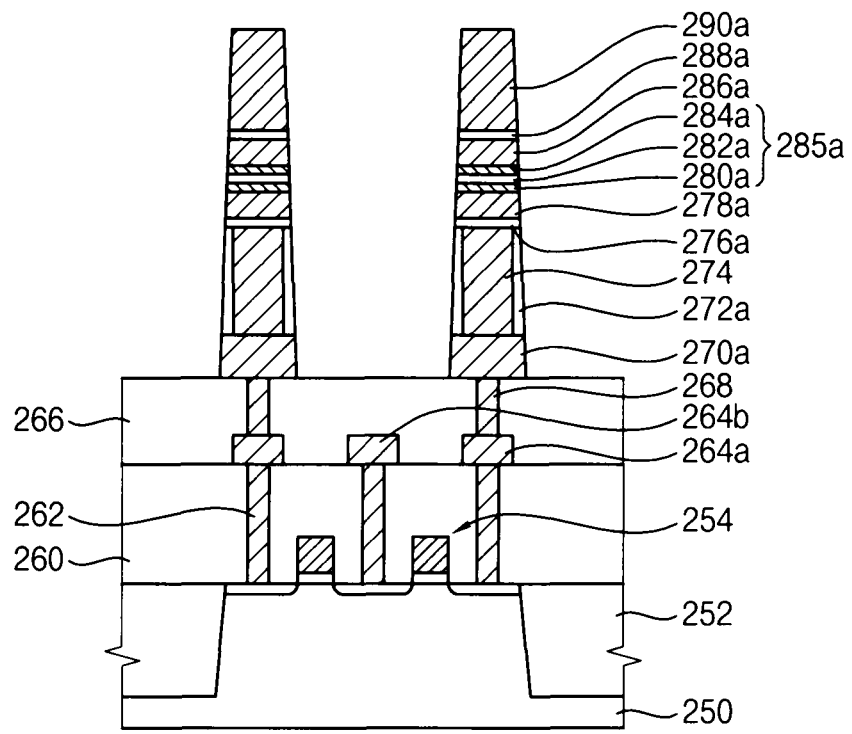

FIGS. 18 to 20 are cross-sectional views illustrating a method of manufacturing a magnetic memory device in accordance with some example embodiments.

The magnetic memory device may include a magnetic pattern obtained by the above-described process.

Referring to FIG. 18, an isolation layer pattern 252 may be formed in a substrate 250 to define an active region and an isolation region therein. The substrate 250 may be a semiconductor substrate. A metal oxide semiconductor (MOS) transistor 254 or other device such as a diode for selecting memory cells may be formed on the substrate 250.

A first insulating interlayer 260 covering the MOS transistor 254 may be formed on the substrate 250. First contact plugs 262 may be formed through the first insulating interlayer 260 to make contact with impurity regions of the MOS transistor 254. First and second pads 264a and 264b electrically connected to the first contact plugs 262 may be formed on the first insulating interlayer 260. A second insulating interlayer 266 covering the first and second pads 264a and 264b may be formed on the first insulating interlayer 260. Second contact plugs 268 may be formed through the second insulating interlayer 266 to make contact with the first pads 264a. The above-described process may be substantially the same as or similar to that illustrated with reference to FIG. 10.

A lower electrode layer 270 may be formed on the second insulating interlayer 266 and the second contact plugs 268. A third insulating interlayer 272 may be formed on the lower electrode layer 270. The third insulating interlayer 272 may be partially removed to form an opening (not illustrated) that may expose the lower electrode layer 270.

A lower pinned layer may be formed on the third insulating interlayer 272 to sufficiently fill the opening. The lower pinned layer may be formed using a material having a vertical magnetization direction. For example, the lower pinned layer may be formed using FePt, CoPt, etc. The magnetization direction of the lower pinned layer may be fixed.

An upper portion of the lower pinned layer may be planarized by, e.g., a CMP process to form a lower pinned layer pattern 274 in the third insulating interlayer 272.

Optionally, an upper portion of the lower pinned layer pattern 274 may be treated or cleaned by RF plasma to remove or reduce damage therein. An additional pinned layer (not illustrated) may be further formed on the lower pinned layer pattern 274. The additional pinned layer may have a thickness of from about 1 Å to about 10 Å.

A coupling layer 276 and an upper pinned layer 278 may be sequentially formed on the third insulating interlayer 272 and the lower pinned layer pattern 274. The coupling layer 276 may be formed using ruthenium. The upper pinned layer 278 may have a fixed vertical magnetization direction substantially opposite to that of the lower pinned layer pattern 274. The upper pinned layer 278 may have a coercive force substantially lower than that of the lower pinned layer pattern 274. The upper pinned layer 278 may prevent a free layer pattern from being magnetized in the same direction as that of the lower pinned layer pattern 274.

A tunnel barrier layer 285 including a first interface layer 280, a metal oxide layer or other suitable dielectric materials 282 and a second interface layer 284 may be formed on the upper pinned layer 278. The first and second interface layers 280 and 284 may be formed using a material that may have a substantially horizontal magnetization direction. The second interface layer 284 may be magnetized in a direction opposite to that of the first interface layer 280. The first and second interface layers 280 and 284 may be formed, for instance, using CoFeB, CoFe, NiFe, etc. The metal oxide layer 282 may be formed, for instance, using MgO, $AlO_x$, etc.

A free layer 286 may be formed on the tunnel barrier layer 285. A capping layer 288 and an upper electrode layer 290 may be formed on the free layer 286.

Referring to FIG. 19, a mask pattern (not illustrated) may be formed on the upper electrode layer 290 by a photolithography process, for instance. The upper electrode layer 290 may be partially removed using the mask pattern as an etching mask to form an upper electrode 290a.

The capping layer 288, the free layer 286, the tunnel barrier layer 285, the upper pinned layer 278 and the coupling layer 276 may be sequentially etched using the upper electrode 290a as a hard mask to form a coupling layer pattern 276a, an upper pinned layer pattern 278a, a tunnel barrier layer pattern 285a, a free layer pattern 286a and the capping layer pattern 288a. The etching process may include an ion-sputtering process. The coupling layer pattern 276a may cover substantially the entire upper surface of the lower pinned layer pattern 274. The tunnel barrier layer pattern 285a may include a first interface layer pattern 280a, a metal oxide layer pattern 282a and a second interface layer pattern 284a.

According to example embodiments, a resputtered conductive material may be prevented from being attached to a sidewall of the tunnel barrier layer pattern 285a to thereby reduce operational failures of a semiconductor device.

Referring to FIG. 20, the third insulating interlayer 272 may be partially etched so that a third insulating interlayer pattern 272a may be formed on a sidewall of the lower pinned layer pattern 274.

The lower electrode layer 270 exposed by the above-etching process may be also etched to form a lower electrode 270a.

According to some embodiments, a magnetic device of the present disclosure may include a semiconductor substrate; a lower electrode layer over the semiconductor substrate; an insulating interlayer overlying the lower electrode layer, the insulating interlayer having an opening exposing a region of the lower electrode layer; a pinned layer pattern filling the opening and contacting the lower electrode layer; a magnetic multi-layer stack structure including at least one free layer pattern overlying the pinned layer pattern; and an upper electrode overlying the magnetic multi-layer stack structure.

In one embodiment, a substantially entire surface of the pinned layer pattern may be substantially coplanar with a top surface of the insulating interlayer.

According to some embodiments, a method of forming a magnetic device includes: forming a lower electrode layer over a substrate; forming an insulating interlayer over the lower electrode layer; partially removing the insulating interlayer to form an opening that exposes a region of the lower electrode layer; filling the opening with a pinned layer pattern contacting the lower electrode layer; and sequentially forming a tunnel barrier layer, a free layer and an upper electrode layer overlying the insulating interlayer and the pinned layer pattern. The method may also include patterning the upper electrode layer, the free layer, the tunnel barrier layer to form a tunnel barrier pattern, a free layer pattern and an upper electrode overlying the pinned layer pattern.

According to some embodiments, a magnetic device of the present disclosure may include a semiconductor substrate having a switching element such as a MOS transistor or a diode formed thereon; a bottom electrode contact electrically coupled to the switching element; a bottom electrode coupled to the bottom electrode contact; an insulating interlayer on the bottom electrode, the insulating interlayer having an opening therethrough to expose a region of the bottom electrode; a pinned layer pattern substantially filling the opening and contacting the bottom electrode; and a magnetic multi-layer stack structure including at least one free layer pattern overlying the pinned layer pattern; and an upper electrode overlying the magnetic multi-layer stack structure.

The principles of the present disclosure can also be applied to combinations of in-plane and perpendicular magnetic devices (e.g., devices in which the free layer has a high perpendicular anisotropy while the equilibrium magnetic moment of the free layer remains in-plane). One example of such a device may be seen in U.S. Pat. No. 6,992,359, the contents of which are incorporated herein by reference in their entirety. Thus, the magnetization of the free layer of the magnetic devices of the present disclosure may be partially in-plane.

The principles of the present disclosure may be applied to a variety of other magnetic devices or magnetic multilayer structures. For example, the principles of the present disclosure may also be applied to any magnetic element having a spin valve, e.g., spin valve spin transfer torque (STT)-MRAM having conductive spacer layers formed of a conductive material such as CR, Ta, Ti, W, and Ru, one example of which is shown in U.S. Pat. No. 7,821,088, the contents of which are incorporated herein by reference in their entirety. Also, the principles of the present disclosure may be applied to spin logic devices. The spin logic devices may be, for example, all-spin logic (ASL) device and non-volatile spin logic device.

Figure 21:
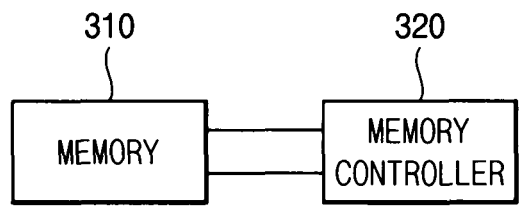

FIG. 21 is a block diagram illustrating a memory system including the magnetic memory device in accordance with example embodiments.

Referring to FIG. 21, the memory system may include a memory 310 operatively connected to a memory controller 320. The memory 310 may include the magnetic memory device configured according to one or more of the example embodiments. The memory controller 320 may provide an input signal for controlling an operation of the memory 310.

Additionally, a memory device configured according to the example embodiments may be used as a memory for a mobile device, a memory card, a computer, etc.

Figure 22:
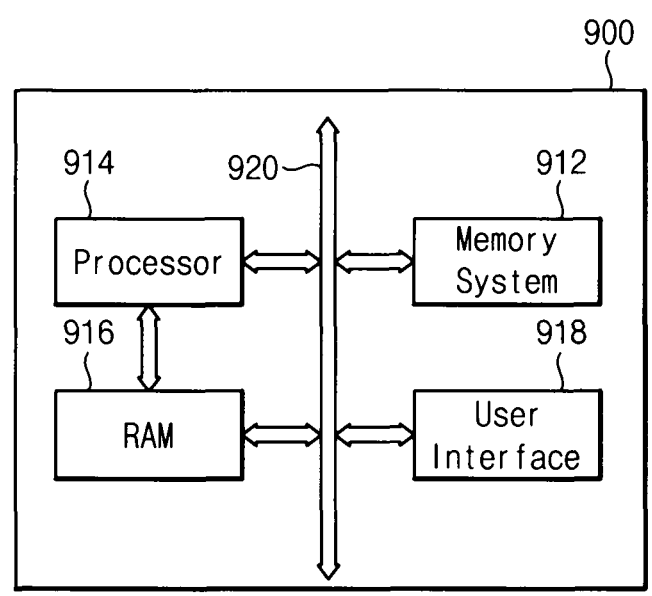

FIG. 22 is a schematic view of an electronic system 900 in which the magnetic device according to an embodiment of the inventive concept is used. The electronic system 900 may be used for a mobile telecommunication device or a computer such as a portable notebook computer, Ultra-Mobile PCs (UMPC), and Tablet PCs. For example, the electronic system 900 may include a memory system 912, a processor 914, RAM 916, and a user interface 918, which may execute data communication using a bus 920. The processor 914 may be a microprocessor or a mobile processor (AP). The processor 914 may have a processor core (not illustrated) that can include a floating point unit (FPU), an arithmetic logic unit (ALU), and a digital signal processing core (DSP Core), or any combinations thereof. The processor 914 may execute the program and control the electronic system 900. The RAM 916 may be used as an operation memory of the processor 914. For example, the processor 914 or the RAM 916 may include a magnetic pattern or device according to example embodiments. Alternatively, the processor 914 and the RAM 916 may be packaged in a single package body. The user interface 918 may be used in inputting/outputting data to/from the electronic system 900. The memory system 912 may store codes for operating the processor 914, data processed by the processor 914, or externally input data. The electronic system 900 may be used in electronic controllers for a variety of electronic devices.

Various operations may be described as multiple discrete steps performed in a manner that is most helpful in understanding the invention. However, the order in which the steps are described does not imply that the operations are order-dependent or that the order that steps are performed must be the order in which the steps are presented.

The foregoing description and drawings are illustrative of example embodiments and are not to be construed as limiting the inventive principles thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A magnetic pattern, comprising:
a lower electrode layer on a substrate;

an insulating interlayer on the lower electrode layer, the insulating interlayer having an opening therethrough;
a first pinned layer pattern filling the opening; and
a second pined layer pattern, a tunnel barrier layer pattern, a free layer pattern and an upper electrode sequentially stacked on the insulating interlayer and the first pinned layer pattern, the second pinned layer pattern covering an upper surface of the first pinned layer pattern,
wherein the second pinned layer pattern has a width greater than that of the first pinned layer pattern.

2. The magnetic pattern of claim 1, further comprising an additional pinned layer pattern between the first pinned layer pattern and the second pinned layer pattern, the additional pinned layer pattern including the same material as that of the first pinned layer pattern.

3. The magnetic pattern of claim 1, wherein the first pinned layer pattern and the second pinned layer pattern have a horizontal magnetization direction.

4. The magnetic pattern of claim 1, wherein the first pinned layer pattern and the second pinned layer pattern have fixed vertical magnetization directions that are different from each other.

\* \* \* \* \*